(12) United States Patent
Kim et al.

(10) Patent No.: US 7,999,280 B2
(45) Date of Patent: Aug. 16, 2011

(54) LIGHT EMITTING DIODE PACKAGE EMPLOYING LEAD TERMINAL WITH REFLECTING SURFACE

(75) Inventors: Hwa Ja Kim, Anyang-si (KR); Nam Young Kim, Seoul (KR); Myung Hee Lee, Inchcon (KR); Kyoung Bo Han, Seoul (KR); Tae Kwang Kim, Seoul (KR); Ji Seop So, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 416 days.

(21) Appl. No.: 11/780,051

(22) Filed: Jul. 19, 2007

(65) Prior Publication Data

US 2008/0048201 A1    Feb. 28, 2008

(30) Foreign Application Priority Data

Aug. 23, 2006  (KR) .................. 10-2006-0079792
Apr. 13, 2007  (KR) .................. 10-2007-0036516

(51) Int. Cl.
  *H01L 33/00*  (2010.01)
(52) U.S. Cl. .................. 257/99; 257/98; 257/E33.027; 313/512; 438/29
(58) Field of Classification Search .................. 257/98, 257/99, 692, 696, E33.058, E33.072; 313/512; 438/29
See application file for complete search history.

(56) References Cited

U.S. PATENT DOCUMENTS

| 3,914,786 | A | 10/1975 | Grossi |
| 6,995,510 | B2* | 2/2006 | Murakami et al. ............ 313/512 |
| 2003/0107316 | A1 | 6/2003 | Murakami |
| 2004/0248332 | A1* | 12/2004 | Yoon ............................... 438/29 |
| 2005/0133939 | A1 | 6/2005 | Chikugawa |
| 2006/0108669 | A1 | 5/2006 | Matsumoto et al. |

FOREIGN PATENT DOCUMENTS

| EP | 1081761 | 3/2001 |
| EP | 1548905 | 6/2005 |
| JP | 60180176 | 9/1985 |
| JP | 2004-146815 | 5/2004 |

(Continued)

OTHER PUBLICATIONS

European Search Report dated Nov. 30, 2007.
European Search Report dated Mar. 16, 2009.
European Examination Report dated Jul. 29, 2010 for European Patent Application No. 07.011 775.9, corresponding to U.S. Appl. No. 11/780,051.

(Continued)

*Primary Examiner* — Jerome Jackson, Jr.
*Assistant Examiner* — Dale Page
(74) *Attorney, Agent, or Firm* — H.C. Park & Associates, PLC

(57) ABSTRACT

Disclosed is a light emitting diode (LED) package employing a lead terminal with a reflecting surface. The package includes first and second lead terminals that are spaced apart from each other. The first lead terminal has a lower portion with an LED chip mounting area, and at least one reflecting surface formed by being bent from the lower portion. Meanwhile, a package body supports the first and second lead terminals and forms a cavity through which the LED chip mounting area and the reflecting surface of the first lead terminal and a part of the second lead terminal are exposed. The first and second lead terminals extend outside of the package body. Accordingly, light emitted from an LED chip can be reflected on the reflecting surface with high reflectivity, so that the optical efficiency of the package can be improved.

20 Claims, 9 Drawing Sheets

FOREIGN PATENT DOCUMENTS

| | | |
|---|---|---|
| JP | 2004-363533 | 12/2004 |
| JP | 2005-183531 | 7/2005 |
| JP | 2005-294736 | 10/2005 |
| JP | 2006-024645 | 1/2006 |
| JP | 2007-194579 | 8/2007 |

OTHER PUBLICATIONS

Preliminary Notice of the First Office Action of Taiwanese Patent Application No. 096116453 issued on Jan. 27, 2011, corresponding to U.S. Appl. No. 11/780,051.

* cited by examiner (a)

(b)

(c)

LIGHT EMITTING DIODE PACKAGE EMPLOYING LEAD TERMINAL WITH REFLECTING SURFACE

CROSS-REFERENCE TO RELATED PATENT APPLICATION

This application claims the benefit of Korean Patent Application No. 10-2006-0079792, filed on Aug. 23, 2006, and Korean Patent Application No. 10-2007-0036516, filed on Apr. 13, 2007, in the Korean Intellectual Property Office, the disclosures of which are incorporated herein in their entirety by reference.

TECHNICAL FIELD

The present invention relates to a light emitting diode package, and more particularly, to a light emitting diode package employing a lead terminal with a reflecting surface.

BACKGROUND ART

Generally, light source systems using light emitting diode (LED) chips are constructed by mounting LED chips in various kinds of packages according to desired uses of the systems. A side-view LED package is disposed at a lateral side of a light guiding plate to provide light in parallel to the light guiding plate. Thus, the side-view LED package is mainly used for backlight illumination for a variety of displays.

FIGS. 1 and 2 are a plan view and a perspective view illustrating a conventional side-view LED package, respectively, and FIG. 3 is a sectional view taken along line A-A in FIG. 1.

Referring to FIGS. 1 to 3, the side-view LED package includes a pair of lead terminals, i.e., first and second lead terminals 11 and 13. The first and second lead terminals are formed from a lead frame, which is made of a phosphor bronze plate, and have surfaces plated with silver (Ag) to improve their reflectivity. The first and second lead terminals 11 and 13 are supported by a package body 15. The package body 15 is formed by insert-molding the lead terminals with polyphthalamide (PPA).

For the sake of convenience of description, the package body 15 can be divided into an upper package body 15a and a lower package body 15b with respect to the position of the first and second lead terminals 11 and 13.

The upper package body 15a has a cavity 16 through which the first and second lead terminals 11 and 13 are exposed. The first and second lead terminals 11 and 13 are positioned at a bottom of the cavity 16, i.e., on the lower package body 15b, and are spaced apart from each other within the cavity. Further, the first and second lead terminals 11 and 13 protrude outside of the package body 15 so as to be electrically connected to an external power source. The outwardly protruding first and second lead terminals 11 and 13 may have a variety of shapes and may be bent in different forms. FIGS. 1 and 2 show the lead terminals 11 and 13 that are bent laterally at a lower surface of the package body 15 so as to ensure surface mounting.

An LED chip 17 is mounted on and electrically connected to the first lead terminal 11 within the cavity 16, and is then electrically connected to the second lead terminal 13 by means of a bonding wire. The cavity 16 may be filled with a light-transmitting resin 23 and phosphors may be contained in the resin.

In the conventional side-view LED package, the cavity 16 is formed to be elongated, and sidewalls defining the cavity, particularly sidewalls 15w on a major axis direction are formed to be inclined so that a viewing angle is increased in the major axis direction. Accordingly, it is possible to provide a side-view LED package suitable for a backlight of a display, and further to provide a side-view LED package capable of emitting white light depending on a proper selection of an LED chip and a phosphor.

However, the conventional side-view LED package has a problem in that light emitted from an LED chip toward the inner walls 15w is absorbed and scattered by the inner walls 15w of the package body, which have low reflectivity, resulting in deterioration of optical efficiency. Further, the inner walls of the package body made of PPA material are discolored by the light incident directly on the package body 15 from the LED chip. Thus, as the LED package is used for a long time, the optical efficiency is further deteriorated, resulting in a decrease in the lifespan of the LED package.

Moreover, since the package body 15 made of a material such as PPA has poor heat-dissipating performance, heat generated in the LED chip cannot be easily dissipated to the outside. As a result, junction temperature increases in the LED chip during operation of the LED chip, leading to deterioration of the optical efficiency.

Meanwhile, if the cavity 16 is filled with the light-transmitting resin 23 containing phosphors, an upper surface of the light-transmitting resin 23 is in the form of a meniscus, resulting in deterioration of the optical efficiency. If the amount of the light-transmitting resin 23 is increased to solve this problem, the light-transmitting resin 23 protrudes upwardly beyond an upper surface of the package body 15 and thus may be easily damaged by an external force. Accordingly, there have been conducted studies on a method of forming a wavelength-converting member confined within the cavity 16 by dotting a small amount of liquid resin containing phosphors on the LED chip. However, since the liquid resin flows down due to the flat bottom of the cavity 16, it is difficult to form a convex wavelength-converting member.

DISCLOSURE OF INVENTION

Technical Problem

An object of the present invention is to provide an LED package with improved optical efficiency.

Another object of the present invention is to provide an LED package, wherein discoloration of inner walls of a package body due to light emitted from an LED chip can be alleviated.

A further object of the present invention is to provide an LED package, wherein a wavelength-converting member can be easily formed by dotting a liquid resin containing a phosphor.

Technical Solution

The present invention provides a light emitting diode (LED) package employing a lead terminal with a reflecting surface. An LED package according to an aspect of the present invention is an LED package having an LED chip mounted within a cavity so as to radiate light emitted from the LED chip in [[an]] a viewing angle. The LED package includes first and second lead terminals that are spaced apart from each other. The first lead terminal has a lower portion with an LED chip mounting area, and at least one reflecting surface formed by being bent from the lower portion. Meanwhile, a package body supports the first and second lead terminals and defines the cavity through which the LED chip mounting area and the reflecting surface of the first lead terminal and a part of the second lead terminal are exposed. The first and second lead terminals extend outside of the package body. The first and second lead terminals are prepared from a lead frame formed by processing a metal plate and are generally plated with a material having high reflectivity. Accordingly, light emitted from the LED chip can be reflected on the reflecting surface with high reflectivity, so that the optical efficiency of the package can be improved and discoloration of the package body due to the light emitted from the LED chip can be prevented or alleviated.

In some embodiments of the present invention, the first lead terminal comprises a step portion formed by being bent from the lower portion, and a first inclined surface for defining the reflecting surface between the lower portion and the step portion. Accordingly, since the light emitted from the LED chip mounted in the LED chip mounting area is reflected on the first inclined surface, light emitting efficiency is improved, and the discoloration of the package body is prevented due to blocking of the light by the first inclined surface.

Meanwhile, the cavity may have an elongated shape. At this time, the first inclined surface of the first lead terminal may cross a major axis direction of the cavity, and may meet inner walls of the package body, which are on a minor axis direction, or may be terminated before meeting the inner walls. Accordingly, it is possible to provide a side-view LED package.

Moreover, the first lead terminal may further comprise a second inclined surface formed by being bent from the lower portion and positioned to face the first inclined surface. Accordingly, it is possible to prevent discoloration of both side inner walls of the package body and to further improve the light emitting efficiency of the LED package.

In addition, the first lead terminal may further comprise third and fourth inclined surfaces formed by being bent from the lower portion and positioned adjacent to the first and second inclined surfaces. Accordingly, reflecting surfaces are formed around the LED chip to further improve the light emitting efficiency and to further prevent discoloration of the package body.

In the meantime, the LED chip may be mounted in the LED chip mounting area of the lower portion, and a bonding wire may connect the LED chip to the second lead terminal. Furthermore, a wavelength-converting member may surround the LED chip. The wavelength-converting member contains a phosphor for converting the wavelength of the light emitted from the LED chip. Accordingly, it is possible to implement light with various colors, particularly white light, by means of combinations of LED chips and phosphors.

The wavelength-converting member may be positioned to be confined by the lower portion of the first lead terminal and the inclined surfaces. The wavelength-converting member may be formed by dotting a liquid resin. At this time, since the wavelength-converting member is confined by the lower portion and the inclined surfaces, the wavelength-converting member can be prevented from protruding beyond an upper surface of the package body. In addition, a transparent molding member may fill the cavity to encapsulate the wavelength-converting member.

In some embodiments of the present invention, the first lead terminal has wing portions for defining inclined surfaces by being bent upwardly from the lower portion to face each other. At this time, the reflecting surface includes the inclined surfaces defined by the wing portions. Accordingly, the reflection efficiency of the light emitted from the LED chip can be enhanced, thus resulting in improvement of the light emitting efficiency of the package, and discoloration of the package body can be prevented.

Meanwhile, the package body may form inner walls defining the cavity together with the wing portions. Accordingly, the thickness of a sidewall of the package body is reduced and heat can be dissipated through the wing portions, so that the heat dissipation performance of the LED package is improved.

To form both side reflecting surfaces that are symmetric with each other, the wing portions may have symmetric structures with respect to the lower portion to which the wing portions are connected. However, the wing portions are not limited thereto but one of the wing portions connected to one side of the lower portion may have a larger width than the other wing portion connected to the other side of the lower portion. Accordingly, the distribution of light radiated from the package can be controlled in various manners.

Meanwhile, at least one of the wing portions may have a width increasing in a direction far away from the lower portion. Accordingly, if the inner walls positioned between the both side reflecting surfaces are inclined, it is possible to form wider reflecting surfaces by means of the wing portion having the increasing width.

Outer surfaces of the wing portions may be covered by the package body. However, it is not limited thereto. At least a part of the outer surfaces of the wing portions may be exposed to the outside. The exposed wing portions further improve the heat dissipation performance of the LED package.

Meanwhile, the second lead terminal may have a lower portion and wing portions for defining inclined surfaces by being bent upwardly from the lower portion to face each other. The wing portions of the second lead terminal may be disposed side by side with respect to the wing portions of the first lead terminal. At this time, the package body may form inner walls defining the cavity together with the wing portions of the first and second lead terminals.

Furthermore, the cavity may be formed to be elongate. At this time, the both side reflecting surfaces defined by the wing portions of the first and second lead terminals may be disposed on both sides with respect to and along the major axis direction of the cavity. Therefore, the wing portions are disposed at wider sides to improve light reflecting efficiency.

The LED chip is mounted in the LED chip mounting area of the lower portion of the first lead terminal, and a bonding wire connects the LED chip to the second lead terminal. In addition, another bonding wire may connect the LED chip to the first lead terminal.

Meanwhile, a wavelength-converting member may cover the LED chip. The wavelength-converting member contains phosphor(s) and thus causes at least a part of light emitted from the LED chip to be subjected to wavelength conversion.

Advantageous Effects

According to the present invention, it is possible to provide an LED package employing reflecting surfaces formed by bending parts of lead terminals so that light emitting efficiency can be improved and discoloration of a package body can be reduced. Further, lead terminals having wing portions can be employed to provide reflecting surfaces and to improve the heat dissipation performance of the package. In addition, it is possible to provide an LED package in which a wavelength-converting member with a proper shape can be easily formed by dotting a liquid resin containing phosphor(s).

BEST MODE FOR CARRYING OUT THE INVENTION

Figure 1:
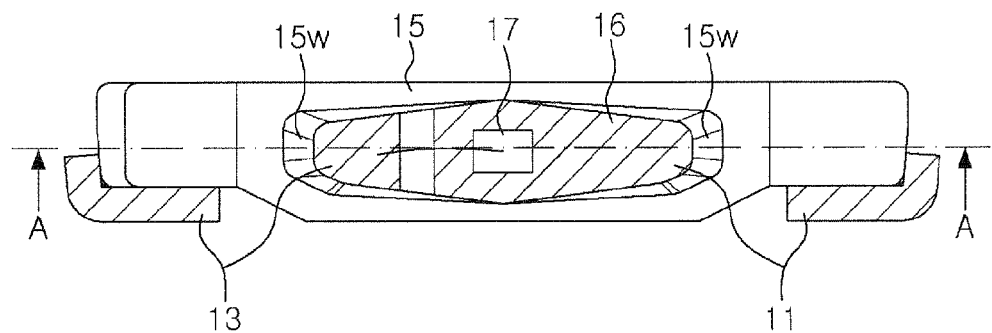
FIG. 1 is a plan view illustrating a conventional side-view LED package.
Figure 2:
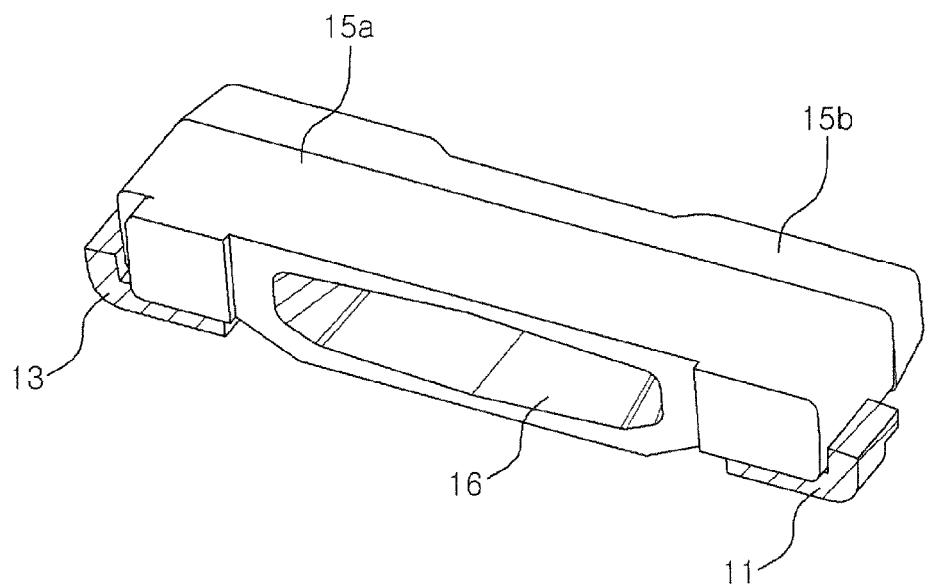
FIG. 2 is a perspective view illustrating the conventional side-view LED package.
Figure 3:
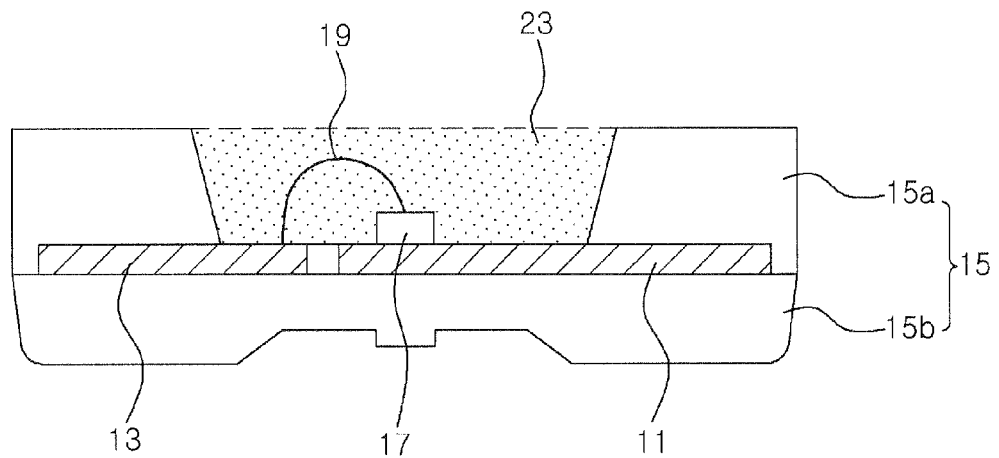
FIG. 3 is a sectional view taken along line A-A in FIG. 1, illustrating the conventional side-view LED package.

Hereinafter, preferred embodiments of the present invention will be described in detail with reference to the accompanying drawings. The following embodiments are provided only for illustrative purposes to fully convey the scope of the present invention to those skilled in the art. Therefore, the present invention is not limited to the embodiments set forth herein but can be implemented in different forms. In the drawings, the widths, lengths, thicknesses and the like of components may be exaggerated for convenience of illustration. Like reference numerals indicate like elements throughout the specification.

Figure 4:
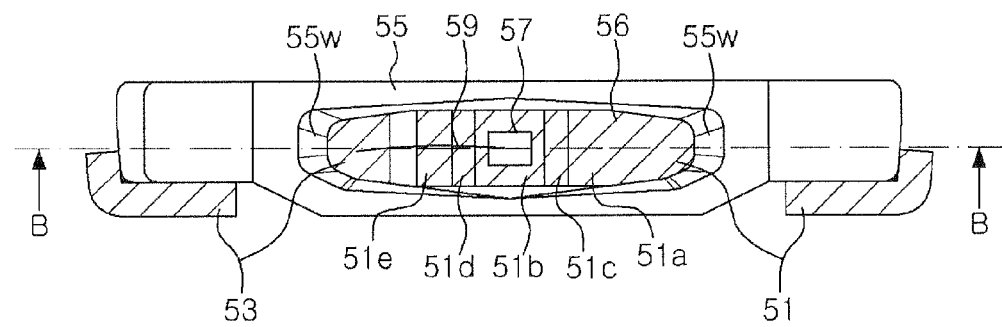
FIG. 4 is a plan view illustrating a side-view LED package according to an embodiment of the present invention.
Figure 5:
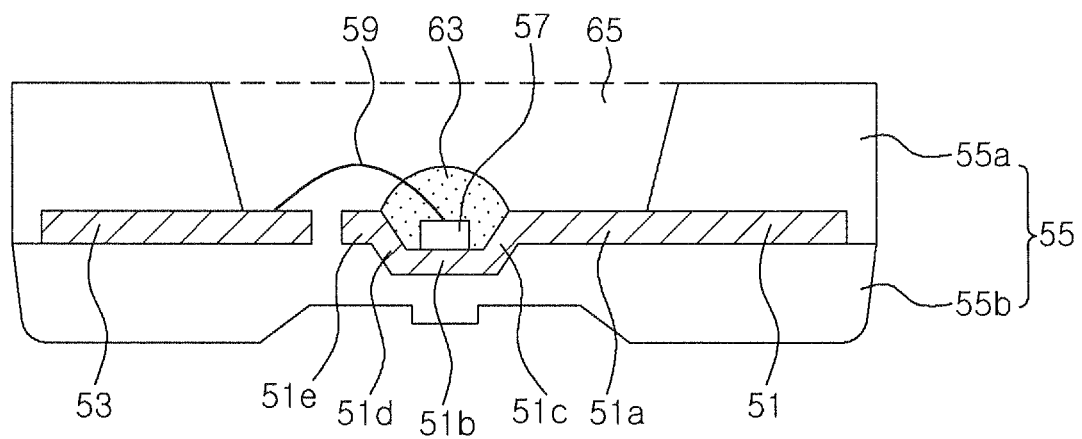
FIG. 5 is a sectional view taken along line B-B in FIG. 4, illustrating the side-view LED package according to the embodiment of the present invention.
Figure 6:
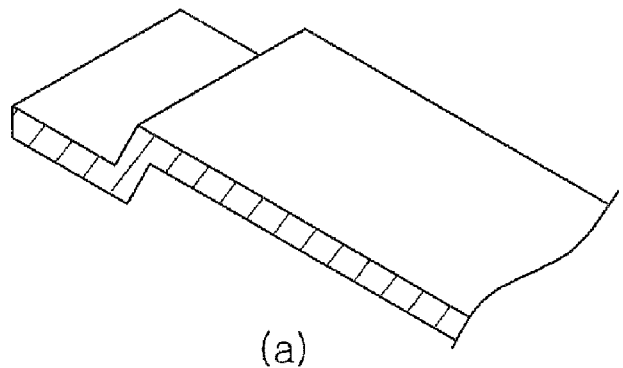
FIG. 6 is perspective views schematically illustrating first lead terminals for a side-view LED package according to embodiments of the present invention.
Figure 6:
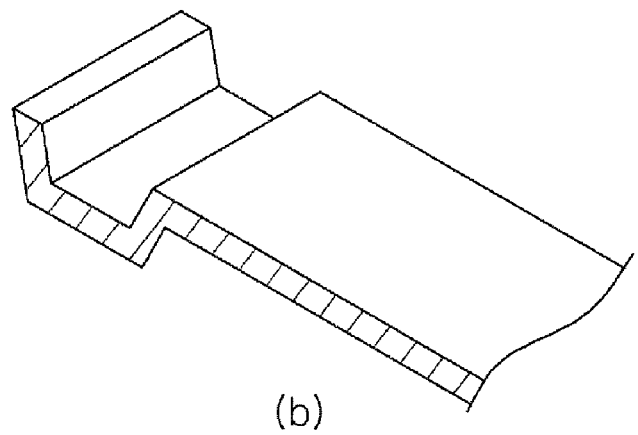
Figure 6:
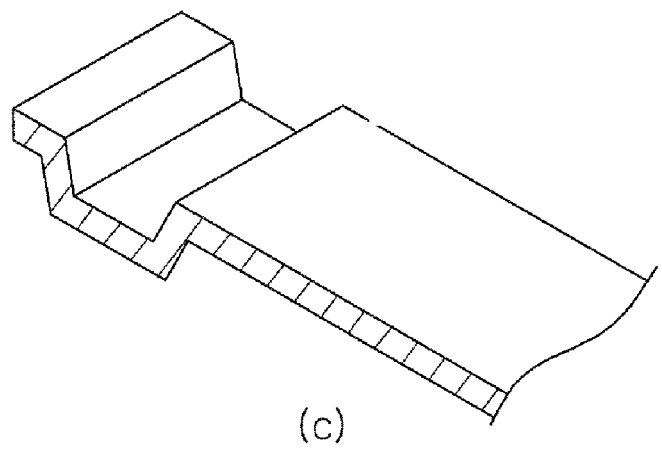
Figure 7:
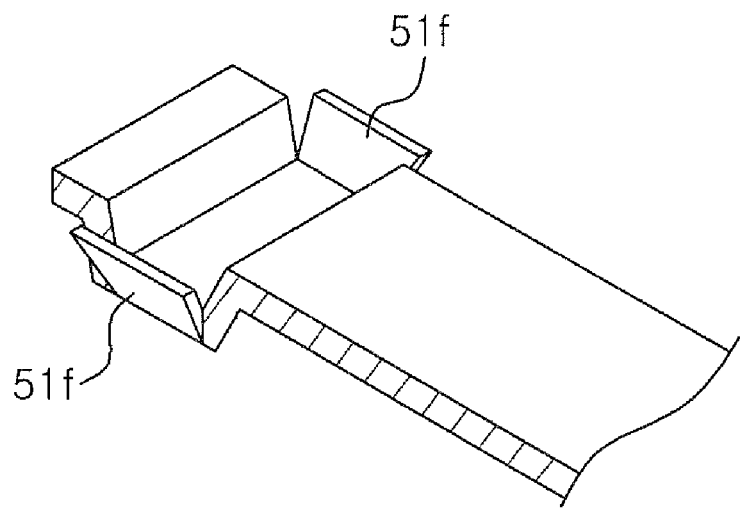
FIG. 7 is a perspective view illustrating a first lead terminal for a side-view LED package according to another embodiment of the present invention.

FIG. 4 is a plan view illustrating a side-view LED package according to an embodiment of the present invention, FIG. 5 is a sectional view taken along line B-B in FIG. 4, FIG. 6 illustrates a variety of first lead terminals applicable to a side-view LED package according to embodiments of the present invention, and FIG. 7 illustrates a first lead terminal applicable to a side-view LED package according to another embodiment of the present invention.

Referring to FIGS. 4 and 5, the side-view LED package includes a pair of lead terminals, i.e., first and second lead terminals 51 and 53. The first lead terminal 51 includes a lower portion 51b, a step portion 51a formed by being bent from the lower portion, and a first inclined surface 51c formed between the lower portion and the step portion (see FIG. 6 (a)). The lower portion 51b includes an LED chip mounting area. Meanwhile, the second lead terminal 53 is spaced apart from the first lead terminal 51 and may be disposed at the same level as the step portion 51a of the first lead terminal 51.

The first and second lead terminals 51 and 53 are formed of a lead frame that is made by processing a metal plate such as a phosphor bronze plate. Particularly, the step portion 51a and the first inclined portion 51c of the first lead terminal 51 are formed by bending certain portions of the lead frame. To improve reflectivity, the first and second lead terminals 51 and 53 may be plated with Ag, Cu, Ni, Au, an Al alloy, an Mg alloy, an alloy of Al and Mg, or the like.

Meanwhile, the first lead terminal 51 may further include a second inclined surface 51d formed by being bent from the lower portion 51b and disposed to face the first inclined surface 51c (see FIG. 6 (b)). In addition, the first lead terminal 51 may further include an end portion 51c extending from the second inclined surface 51d and disposed horizontally at the same level as the step portion 51a (see FIG. 6 (c)). The end portion 51e provides a smooth bottom surface to improve optical reflectivity.

The first and second lead terminals 51 and 53 are supported by a package body 55. The package body 55 may be formed by insert-molding the lead terminals 51 and 53. For the sake of convenience of description, the package body 55 will be divided into an upper package body 55a and a lower package body 55b with respect to the position of the step portion 51a of the first lead terminal and the second lead terminal 53.

The package body 55 may have an elongated cavity 56 through which the first and second lead terminals 51 and 53 are exposed. The lower portion 51b and the inclined surfaces 51 and 51d of the first lead terminal, and a part of the second lead terminal 53 are exposed through the cavity 56. Further, a part of the step portion 51a of the first lead terminal may be exposed therethrough. Hereinafter, a longitudinal direction of the elongated cavity 56 is defined as a major axis direction, and a direction perpendicular thereto is defined as a minor axis direction.

The first and second lead terminals 51 and 53 are spaced apart from each other within the cavity 56. Moreover, the first and second lead terminals 51 and 53 extend outwardly while penetrating through sidewalls of the package body 55 so as to be electrically connected to an external power source. The outwardly extending lead terminals 51 and 53 may have a variety of shapes and may be bent in different forms. Here, there are shown the lead terminals 51 and 53 bent laterally at a lower surface of the package body 55 so as to ensure surface mounting.

The lower portion 51b of the first lead terminal is positioned to be depressed toward the lower package body 55b, and thus, a concave portion is formed at a bottom of the cavity 56. Meanwhile, the first inclined surface 51c of the first lead terminal crosses the major axis direction of the cavity 56, and meets inner walls of the package body 55, which are on the minor axis direction, or is terminated before meeting the inner walls. That is, the first inclined surface 51c exposed through the cavity 56 is intermittent rather than continuous. Therefore, it is possible to improve reflectivity in the major axis direction without changing characteristics of a viewing angle in the minor axis direction, and to separately control optical distributions in the major and minor axis directions. The second inclined surface 51d of the first lead terminal also crosses the major axis direction of the cavity 56, and meets the inner walls of the package body 55, which are on the minor axis direction, or is terminated before meeting the inner walls. That is, the second inclined surface 51d is formed to be symmetric with the first inclined surface 51c, resulting in a symmetric optical distribution.

An LED chip 57 is mounted in the LED chip mounting area of the lower portion 51b and then electrically connected to the second lead terminal 53 by means of a bonding wire 59. Therefore, light emitted from the LED chip 57 toward inner walls 55w of the package body 55, which are on the major axis direction, is reflected on the first and second inclined surfaces 51c and 51d before reaching the inner walls 55w of the package body 55. Since the first lead terminal 51 is plated with a metal having high reflectivity, it is possible to achieve higher reflectivity as compared with a package body made of plastic such as PPA. Therefore, since a part of the light emitted from the LED chip is reflected on the inclined surfaces 51c and 51d with high reflectivity, the optical efficiency of the side-view LED package is improved. Further, it is possible to reduce the amount of light incident directly on the inner walls of the package body, thereby alleviating discoloration of the inner walls of the package body 55 and consequently extending the lifespan of the package.

Meanwhile, in order to improve reflectivity in the minor axis direction and prevent discoloration of the inner walls of the package body 55, which are on the minor axis direction, the first lead terminal may include wing portions 51f extending from the lower portion 51b toward both sides of the cavity 56 in the minor axis direction (see FIG. 7). The wing portions are formed by being bent from the lower portion to define third and fourth inclined surfaces, and the third and fourth inclined surfaces are also exposed within the cavity 56. Since the wing portions 51f are separated from the first and second inclined surfaces 51c and 51d, they can be bent to have inclination angles different from those of the first and second inclined surfaces, thereby independently controlling reflection characteristics in the major and minor axis directions. Features of the wing portions will be described below in detail with reference to FIGS. 8 to 12.

Referring again to FIG. 5, a wavelength-converting member 63 containing a phosphor can be formed over the LED chip 57. The wavelength-converting member may be formed by dotting a liquid resin containing the phosphor within the concave portion defined on the lower portion 51b. Thus, it is possible to form the convex wavelength-converting member 63 confined by the concave portion. Since a conventional side-view LED package has a flat bottom surface, it is difficult to form the wavelength-converting member by dotting the liquid resin. However, since the concave portion is formed within the cavity 56 according to the embodiments of the present invention, it is possible to easily form the wavelength-converting member confined by the concave portion using the liquid resin.

The wavelength-converting member 63 may be made of, for example, epoxy or silicone resin, and may contain phosphor(s) for converting light emitted from the LED chip 57, e.g., blue light, into yellow light. Accordingly, it is possible to provide a side-view LED package capable of emitting white light. The LED chip 57 and the phosphor(s) may be selected in various manners to implement a variety of colors.

Meanwhile, the cavity 56 may be filled with the wavelength-converting member 63 or may be filled by forming the wavelength-converting member 63 within the concave portion and further forming a transparent molding member within the cavity.

Figure 8:
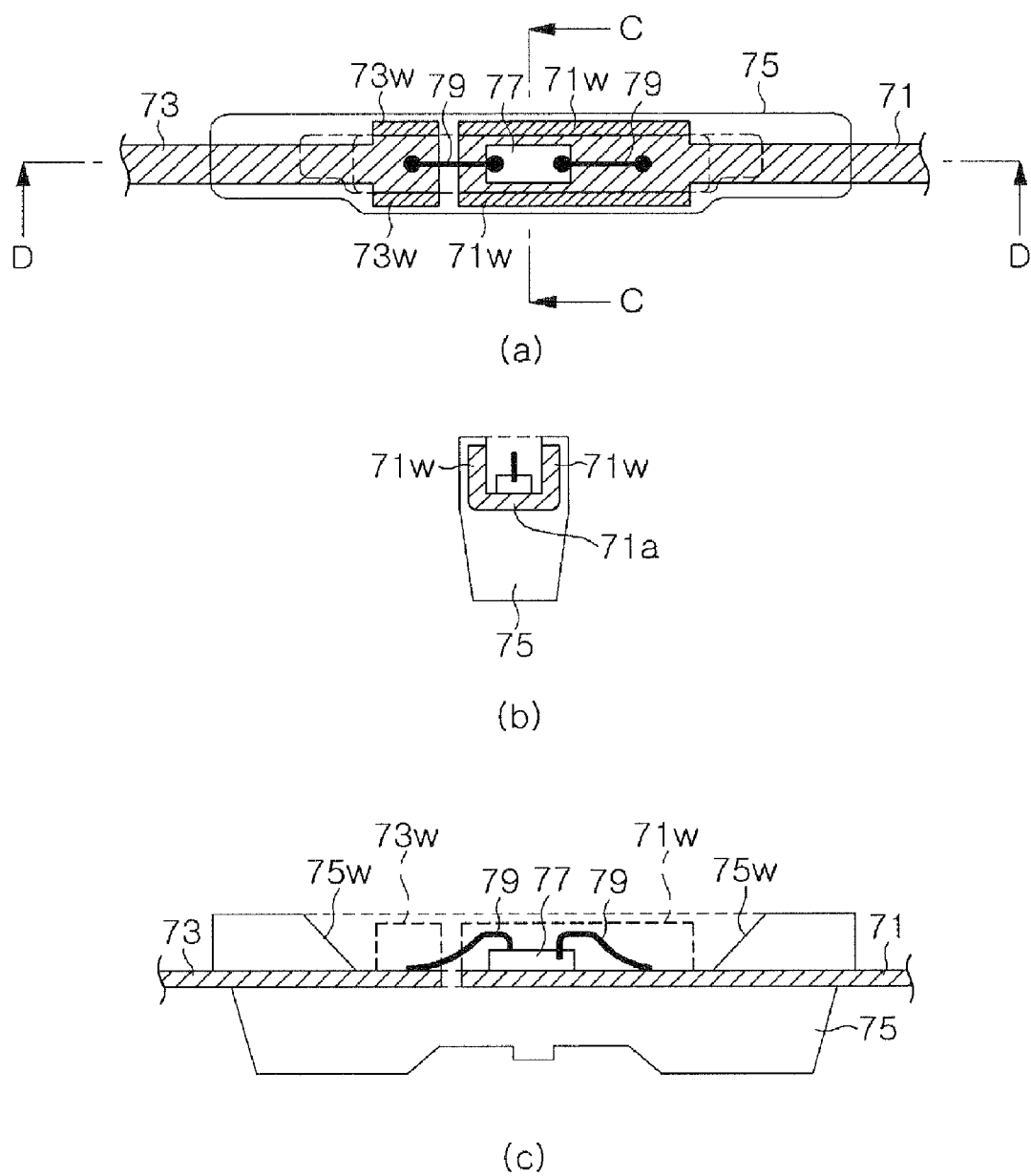
FIG. 8 is schematic views illustrating a side-view LED package according to another embodiment of the present invention.

FIG. 8 is schematic views illustrating a side-view LED package according to another embodiment of the present invention, wherein (a) is a plan view seeing through a package body, (b) is a sectional view taken along line C-C in (a), and (c) is a sectional view taken along line D-D in (a) in which wing portions are indicated by dotted lines.

Referring to FIG. 8, the side-view LED package includes a pair of lead terminals, i.e., first and second lead terminals 71 and 73. The first and second lead terminals 71 and 73 are formed of a lead frame that is made of a metal plate such as a phosphor bronze plate, and may be plated with Ag, Cu, Ni, Au, an Al alloy, an Mg alloy, an alloy of Al and Mg, or the like to improve reflectivity.

The first lead terminal 71 includes a lower portion 71a having an LED chip mounting area, and wing portions 71w forming inclined surfaces by being bent from the lower portion upwardly so that the wing portions face each other. The inclined surfaces form reflecting surfaces at both sides of the LED chip mounting area. Meanwhile, the second lead terminal 73 may include a lower portion 73a, and wing portions 73w forming inclined surfaces by being bent from the lower portion 73a upwardly so that the wing portions face each other. The first and second lead terminals 71 and 73 are spaced apart from each other, and the wing portions 71w and 73w thereof are disposed side by side to form the both side reflecting surfaces. The wing portions 71w and 73w may have symmetric structures respectively with respect to the lower portions 71a and 73a to which the wing portions are connected, as shown in the figure. Accordingly, it is possible to obtain a symmetric optical distribution. However, the wing portions 71w and 73w are not limited thereto but may have asymmetric structure with different widths.

Meanwhile, a package body 75 is coupled with the first and second lead terminals 71 and 73 to support the lead terminals. The package body 75 may be formed by insert-molding the lead terminals 71 and 73. The package body 75 covers bottom surfaces of the first and second lead terminals 71 and 73 and surrounds outer surfaces of the wing portions 71w and 73w. Further, the package body 75 may fill a gap between the lower portion 71a of the first lead terminal and the lower portion 73a of the second lead terminal and a gap between the wing portions 71w and 73w. In addition, the package body 75 may cover upper end surfaces of the wing portions 71w and 73w.

The first and second lead terminals 71 and 73 extend outside of the package body 75 so as to be electrically connected to an external power source. The outwardly protruding first and second lead terminals 71 and 73 may have a variety of shapes and may be bent in different forms.

Meanwhile, the wing portions 71w and 73w of the first and second lead terminals 71 and 73 are disposed side by side to form both side reflecting surfaces, and the package body 75 may form inner walls of the cavity together with the wing portions. Particularly, the package body 75 forms both side inner walls 75w connecting the reflecting surfaces defined by the wing portions 71w and 73w. As shown in the figure, the inner walls 75w may be formed to be inclined. Meanwhile, the lower portions 71a and 73a of the first and second lead terminals 71 and 73 form a bottom surface of the cavity. Accordingly, the cavity is formed as shown in FIG. 8 (a).

Meanwhile, an LED chip 77 is mounted in the LED chip mounting area of the first lead terminal 71 and then connected to the second lead terminal 73 by means of a bonding wire 79. The LED chip 77 may be connected to the first and second lead terminals 71 and 73 by means of two bonding wires 79 or may be electrically connected to the first lead terminal 71 by means of a conductive adhesive and to the second lead terminal 73 by means of one bonding wire 79. The first lead terminal 71 has the lower portion 71a longer than that of the second lead terminal 73 so as to mount the LED chip 77 thereon.

Meanwhile, a wavelength-converting member (not shown) may cover the LED chip 77. The wavelength-converting member may be made of, for example, epoxy or silicone resin, and may contain phosphor(s) for converting light emitted from the LED chip 77, e.g., blue light, into yellow light so that at least a part of the light emitted from the LED chip is subjected to wavelength conversion. The LED chip 77 and the phosphor(s) may be selected in various manners to implement light with various colors. The wavelength-converting member may be positioned within or over the cavity.

According to this embodiment, the lead terminals are disposed at the bottom surface and the both side surfaces of the cavity so that the reflection efficiency of the light emitted from the LED chip 77 can be improved. Particularly, in the side-view LED package having the elongated cavity, the wing portions are positioned at side surfaces formed parallel with the major axis direction, resulting in formation of the reflecting surfaces over a wide area. Meanwhile, the wing portions 71w and 73w reflect light incident toward the package body 75, thereby reducing discoloration of the package body 75 by light. Further, since heat can be dissipated through the wing portions, the heat dissipation performance of the package can be improved. In addition, if the thickness of the package body 75 surrounding the outer surfaces of the wing portions is decreased, heat dissipation through the package body is promoted, resulting in further improvement of the heat dissipation performance.

Figure 9:
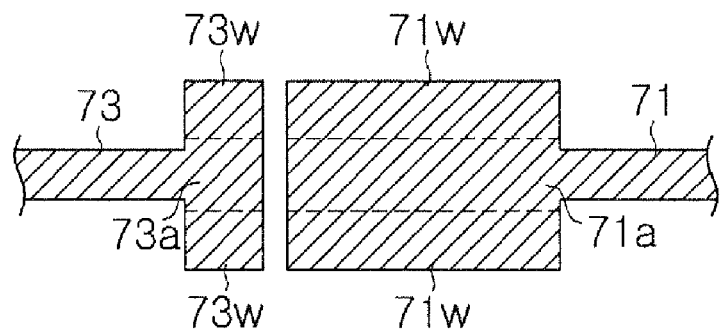
FIG. 9 is a plan view illustrating a lead frame for use in fabricating the side-view LED package according to the another embodiment of the present invention.

The first and second lead terminals 71 and 73 in this embodiment can be formed of a lead frame as shown in FIG. 9. That is, the first and second lead terminals 71 and 73 that are spaced apart from each other are formed by punching or pressing a flat metal plate such as a phosphor bronze plate. The first and second lead terminals 71 and 73 have the lower portions 71a and 73a and the wing portions 71w and 73w extending from both sides of the lower portions, respectively. As the wing portions 71w and 73w are bent upwardly, the reflecting surfaces are formed at the both sides.

Figure 10:
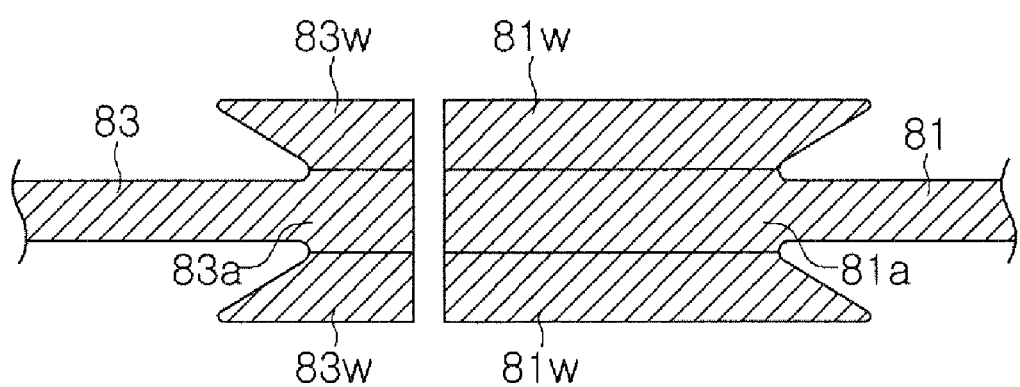
FIG. 10 is a plan view illustrating other example of the lead frame.

Although the first and second lead terminals 71 and 73 are shown as having the rectangular wing portions 71w and 73w in this embodiment, they are not limited thereto. As shown in FIG. 10, it is possible to use first and second lead terminals 81 and 83 having wing portions 81w and 83w each of which has a width increasing in a direction far away from a lower portion 81a or 83a. The wing portions 81w and 83w having the increasing widths can provide wider reflecting surfaces at elongated both sides, for example, if the inner walls 75w are formed to be inclined as shown in FIG. 8.

Figure 11:
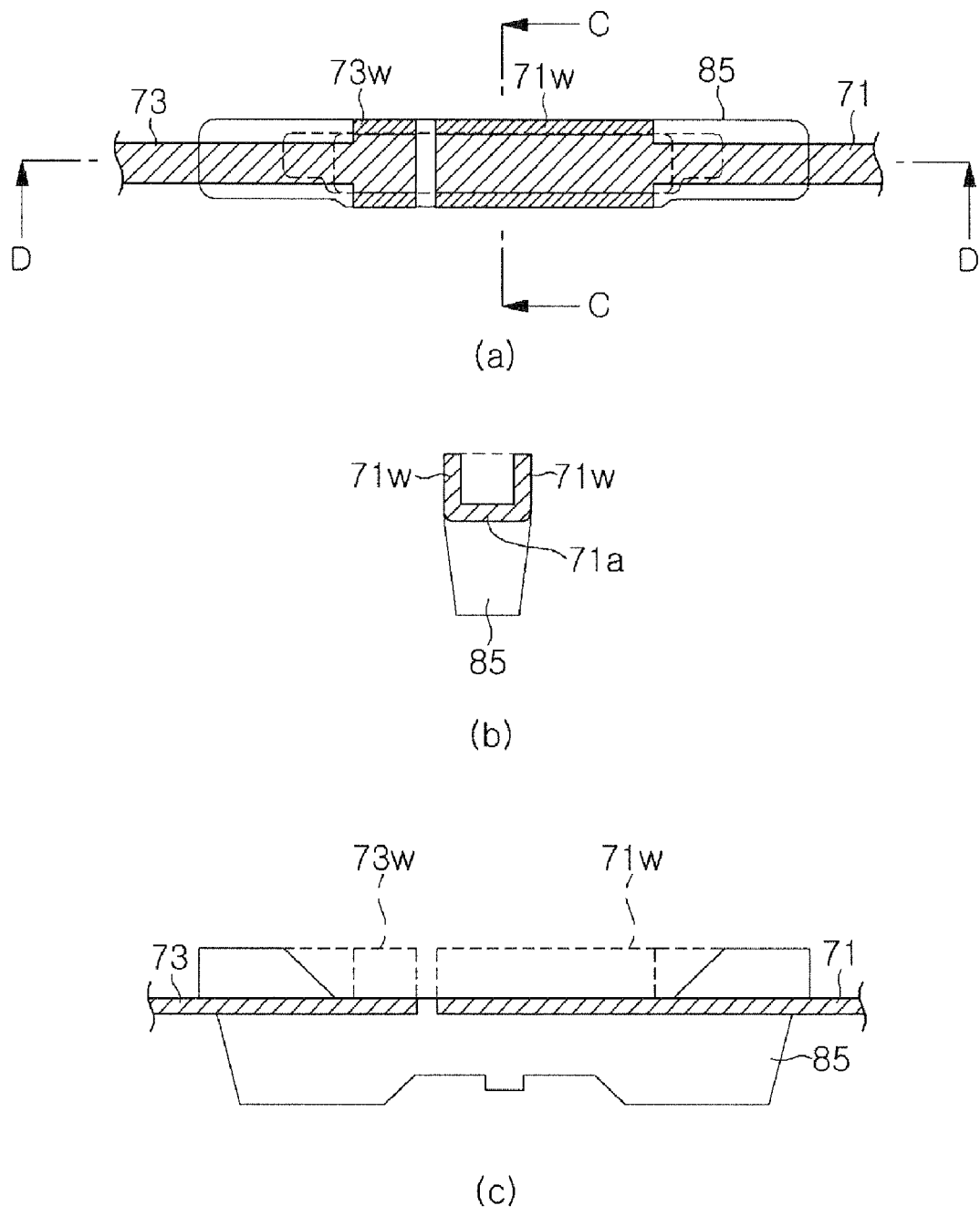
FIG. 11 is schematic views illustrating a side-view LED package according to a further embodiment of the present invention.

FIG. 11 is schematic views illustrating a side-view LED package according to a further embodiment of the present invention, wherein (a) is a plan view seeing through a package body, (b) is a sectional view taken along line C-C in (a), and (c) is a sectional view taken along line D-D in (a) in which wing portions are indicated by dotted lines. For the sake of convenience of illustration, an LED chip and a bonding wire are omitted.

The LED package of FIG. 11 has components substantially identical with those of the side-view LED package described with reference to FIG. 8. However, there is a difference in that outer surfaces of the wing portions 71w and 73w are exposed outside of a package body 85. That is, in this embodiment, at least a part of the outer surfaces of the wing portions 71w and 73w are exposed to the outside. Accordingly, heat generated from the package can be dissipated to the outside through the wing portions, resulting in improvement of heat dissipation efficiency.

Figure 12:
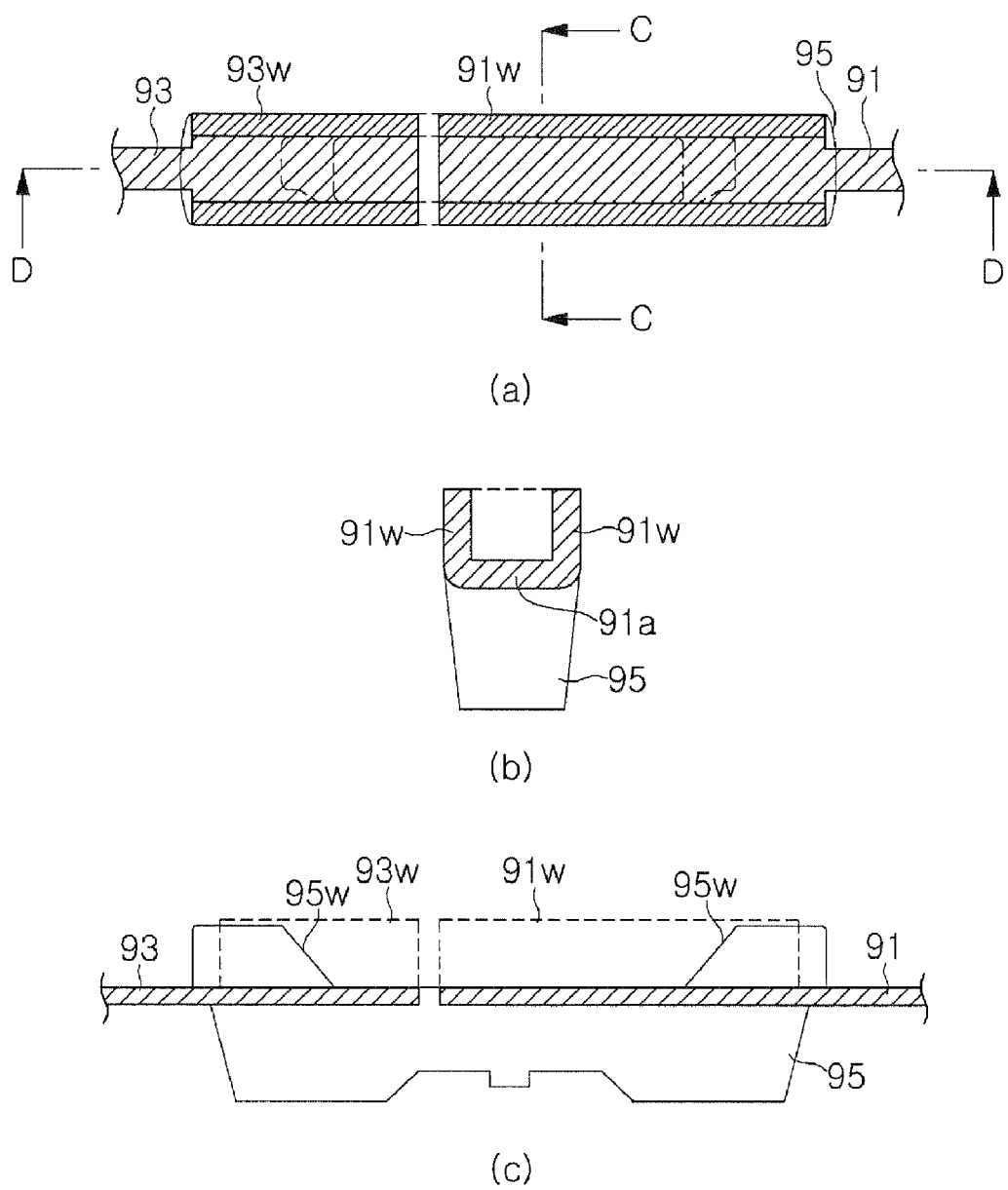
FIG. 12 is schematic views illustrating a side-view LED package according to a still further embodiment of the present invention.

FIG. 12 is schematic views illustrating a side-view LED package according to a still further embodiment of the present invention, wherein (a) is a plan view seeing through a package body, (b) is a sectional view taken along line C-C in (a), and (c) is a sectional view taken along line D-D in (a) in which wing portions are indicated by dotted lines. For the sake of convenience of illustration, an LED chip and a bonding wire are omitted.

The LED package of FIG. 12 has components substantially identical with those of the side-view LED package described with reference to FIG. 8. However, there is a difference in that a lower portion 91a of a first lead terminal 91, a lower portion 93a of a second lead terminal 93, and wing portions 91w and 93w of the first and second lead terminals are formed longer than corresponding components of FIG. 8, and the wing portions 91w and 93w construct the majority of both side surfaces of the package. Meanwhile, a package body 95 couples the first and second lead terminals 91 and 93 and supports them. The package body 95 covers bottom surfaces of the first and second lead terminals 91 and 93, and fills a gap between the first and second lead terminals to couple them with each other. Further, the package body 95 is formed between both side reflecting surfaces defined by the wing portions 91w and 93w, thereby forming inner walls 95w. The inner walls 95w may be formed to be inclined.

According to the embodiment, heat dissipation efficiency can be further improved by increasing the widths of the wing portions 91w and 93w nearly to the width of the package body 95.

Although the embodiments of the present invention have been described and illustrated by way of example in connection with the side-view LED package having the elongated cavity, the present invention is not limited to the side-view LED package but may be applied to various types of packages using a plastic package body and a lead frame, for example, even to a package with a circular or rectangular cavity.

Meanwhile, in the embodiments of the present invention, if the wing portions are provided only at the first lead terminal, the lower portion of the second lead terminal may have a width smaller than that of the bottom surface of the cavity. Meanwhile, the LED chip mounting area of the first lead terminal may extend to surround both sides of the lower portion of the second lead terminal. Accordingly, it is possible to implement both side reflecting surfaces with larger areas by means of the wing portions of the first lead terminal.

The invention claimed is:

1. A light emitting diode (LED) package having an LED chip mounted within a cavity so as to radiate light emitted from the LED chip in a viewing angle, the LED package comprising:
    a first lead terminal having a lower portion with an LED chip mounting area, and at least one reflecting surface formed by being bent from the lower portion;
    a second lead terminal spaced apart from the first lead terminal; and
    a package body for supporting the first and second lead terminals and defining the cavity through which the LED chip mounting area of the first lead terminal and a part of the second lead terminal are exposed,
    wherein the first and second lead terminals extend outside of the package body, and
    wherein at least a part of an outer surface of the at least one reflecting surface of the first lead terminal is exposed to the outside, the part of the outer surface exposed to the outside not being exposed within the cavity.

2. The LED package as claimed in claim 1, wherein the first lead terminal comprises a step portion formed by being bent from the lower portion, and a first inclined surface forming a second reflecting surface between the lower portion and the step portion.

3. The LED package as claimed in claim 2, wherein the first lead terminal further comprises a second inclined surface formed by being bent from the lower portion and positioned to face the first inclined surface.

4. The LED package as claimed in claim 3, wherein the first lead terminal further comprises third and fourth inclined surfaces formed by being bent from the lower portion and positioned adjacent to the first and second inclined surfaces.

5. The LED package as claimed in claim 3, further comprising:
    at least one LED chip mounted in the LED chip mounting area of the lower portion;

a bonding wire connecting the LED chip to the second lead terminal; and a wavelength-converting member surrounding the LED chip.

6. The LED package as claimed in claim 4, further comprising:

at least one LED chip mounted in the LED chip mounting area of the lower portion;

a bonding wire connecting the LED chip to the second lead terminal; and a wavelength-converting member surrounding the LED chip.

7. The LED package as claimed in claim 5, wherein the wavelength-converting member is positioned to be confined by the lower portion of the first lead terminal and the inclined surfaces.

8. The LED package as claimed in claim 7, further comprising a transparent molding member filling the cavity to encapsulate the wavelength-converting member.

9. The LED package as claimed in claim 1, wherein the first lead terminal has wing portions forming inclined surfaces by being bent upwardly from the lower portion to face each other, and the reflecting surface includes the inclined surfaces formed by the wing portions.

10. The LED package as claimed in claim 9, wherein the package body forms inner walls defining the cavity together with the wing portions.

11. The LED package as claimed in claim 9, wherein at least one wing portion has a first length at a portion where it meets the lower portion and a second length along an outermost portion, the second length being greater than the first length.

12. The LED package as claimed in claim 9, wherein outer surfaces of the wing portions are covered by the package body.

13. The LED package as claimed in claim 9, wherein at least a part of the outer surfaces of the wing portions are exposed to the outside.

14. The LED package as claimed in claim 9, wherein the second lead terminal has a lower portion and wing portions forming inclined surfaces by being bent upwardly from the lower portion to face each other, and the wing portions of the second lead terminal are disposed side by side with respect to the wing portions of the first lead terminal.

15. The LED package as claimed in claim 14, wherein the package body forms inner walls defining the cavity together with the wing portions of the first and second lead terminals.

16. The LED package as claimed in claim 14, wherein outer surfaces of the wing portions of the first and second lead terminals are covered by the package body.

17. The LED package as claimed in claim 14, wherein at least a part of the outer surfaces of the wing portions of the first and second lead terminals are exposed to the outside.

18. The LED package as claimed in claim 4, wherein the third and fourth inclined surfaces are separated from the first and second inclined surfaces.

19. The LED package as claimed in claim 13, wherein the part of the outer surfaces of the wing portions exposed to the outside and the inclined surfaces bent upwardly from the lower portion of the wing portions are opposite sides of the wing portions.

20. The LED package as claimed in claim 17, wherein the part of the outer surfaces of the wing portions of the first and second lead terminals exposed to the outside and the inclined surfaces bent upwardly from the lower portion of the wing portions of the first and second lead terminals are opposite sides of the wing portions of the first and second lead terminals, respectively.

* * * * *